US012707564B2

(12) United States Patent
Kuo et al.

(10) Patent No.: US 12,707,564 B2
(45) Date of Patent: Aug. 11, 2026

(54) FLEXIBLE CIRCUIT BOARD

(71) Applicant: CHIPBOND TECHNOLOGY CORPORATION, Hsinchu (TW)

(72) Inventors: Ting-Yi Kuo, Kaohsiung City (TW); Yi-Ling Hsieh, Kaohsiung City (TW); Chiu-Hung Lai, Kaohsiung City (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 184 days.

(21) Appl. No.: 18/619,356

(22) Filed: Mar. 28, 2024

(65) Prior Publication Data

US 2025/0203770 A1 Jun. 19, 2025

(30) Foreign Application Priority Data

Dec. 19, 2023 (TW) ................................ 112149602

(51) Int. Cl.
*H05K 1/00* (2006.01)
*H05K 1/03* (2006.01)
*H05K 3/3465* (2026.01)

(52) U.S. Cl.
CPC ......... *H05K 1/0393* (2013.01); *H05K 3/3465* (2026.01); *H05K 2201/09045* (2013.01); *H05K 2201/09781* (2013.01); *H05K 2203/0562* (2013.01)

(58) Field of Classification Search
CPC ............... H05K 1/0393; H05K 3/3465; H05K 2201/09045; H05K 2201/09781
See application file for complete search history.

(56) References Cited

U.S. PATENT DOCUMENTS

2016/0143150 A1* 5/2016 Happoya .............. H05K 3/3452 156/280
2022/0330416 A1 10/2022 Zhang et al.

FOREIGN PATENT DOCUMENTS

CN 107211529 A * 9/2017 ............... H05K 1/02
CN 115620638 A 1/2023
TW M654110 U 4/2024
WO WO-2015033736 A1 * 3/2015 ........... H05K 1/0283

OTHER PUBLICATIONS

Taiwanese office action mailed Sep. 3, 2024 for Taiwanese Patent Application No. 112149602, 3 pages.

* cited by examiner

*Primary Examiner* — Pete T Lee

(74) *Attorney, Agent, or Firm* — Demian K. Jackson; Jackson IPG PLLC

(57) ABSTRACT

A flexible circuit board includes a flexible substrate, circuit lines, a solder resist layer and shaping strips. The flexible substrate has a first part and a second part which is wider than the first part and easy to be bent. The circuit lines are arranged on the flexible substrate and covered by the solder resist layer. The shaping strips are arranged on the solder resist layer located on the second part and are provided to help to shape the bent second part back to the original one as flat pressing the flexible circuit board.

7 Claims, 5 Drawing Sheets

FLEXIBLE CIRCUIT BOARD

CROSS-REFERENCE TO RELATED APPLICATIONS

This application claims priority to R.O.C patent application No. 112149602 filed Dec. 19, 2023, the disclosure of which is hereby incorporated by reference in its entirety.

FIELD OF THE INVENTION

This invention relates to a flexible circuit board, and more particularly to a flexible circuit board which can be shaped back to the original one if it is bent and/or deformed.

BACKGROUND OF THE INVENTION

Referring to FIGS. 1 and 2, a conventional circuit board 20 includes a substrate 21, circuit lines 22 and a solder resist layer 23. A first bonding area 21*a*, a second bonding area 21*b* and a chip mounting area 21*c* are defined on the surface of the substrate 21. The first bonding area 21*a* is located on one side of the substrate 21, the second bonding area 21*b* is located on the other side of the substrate 21, and the chip mounting area 21*c* is located between the first bonding area 21*a* and the second bonding area 21*b*. The circuit lines 22 are provided on the substrate 21 and leads (not shown) of the circuit lines 22 are arranged on the first bonding area 21*a*, the second bonding area 21*b* or the chip mounting area 21*c*. The solder resist layer 23 covers the circuit lines 22 but not cover the leads of the circuit lines 22.

The second bonding area 21*b* is designed to be wider than the first bonding area 21*a* in order to arrange more circuit lines on the area between the second bonding area 21*b* and the chip mounting area 21*c*. However, the lower part of the substrate 21 where the wider second bonding area 21*b* is located on is easy to be bent or deformed, and it is difficult to shape the substrate 21 back to the original one even though flat pressing the flexible circuit board 20.

SUMMARY OF THE INVENTION

One object of the present invention is to provide a flexible circuit board which includes shaping strips arranged on an area where may be bent or deformed easily. While the deformed flexible circuit board is pressed flatly down, the shaping strips can help to shape the deformed flexible circuit board back to the original one.

A flexible circuit board of the present invention includes a flexible substrate, circuit lines, a solder resist layer and shaping strips. The flexible substrate is divided into a first part and a second part which are connected to each other, and a first width of the first part is less than a second width of the second part in a first direction. The circuit lines are arranged on a surface of the flexible substrate, and the solder resist layer is provided to cover the surface and the circuit lines. The shaping strips are arranged on the solder resist layer located on the second part along the first direction, and they are extended along a second direction intersecting the first direction. A space exists between the adjacent shaping strips to expose the solder resist layer.

The shaping strips are arranged in the first direction and extended in the second direction such that the top surface of the flexible circuit board where is above the second part is undulate. Even the second part is bent and/or deformed, it can be shaped back to the original flat form after flat pressing the flexible circuit board.

DETAILED DESCRIPTION OF THE INVENTION

Figure 1:
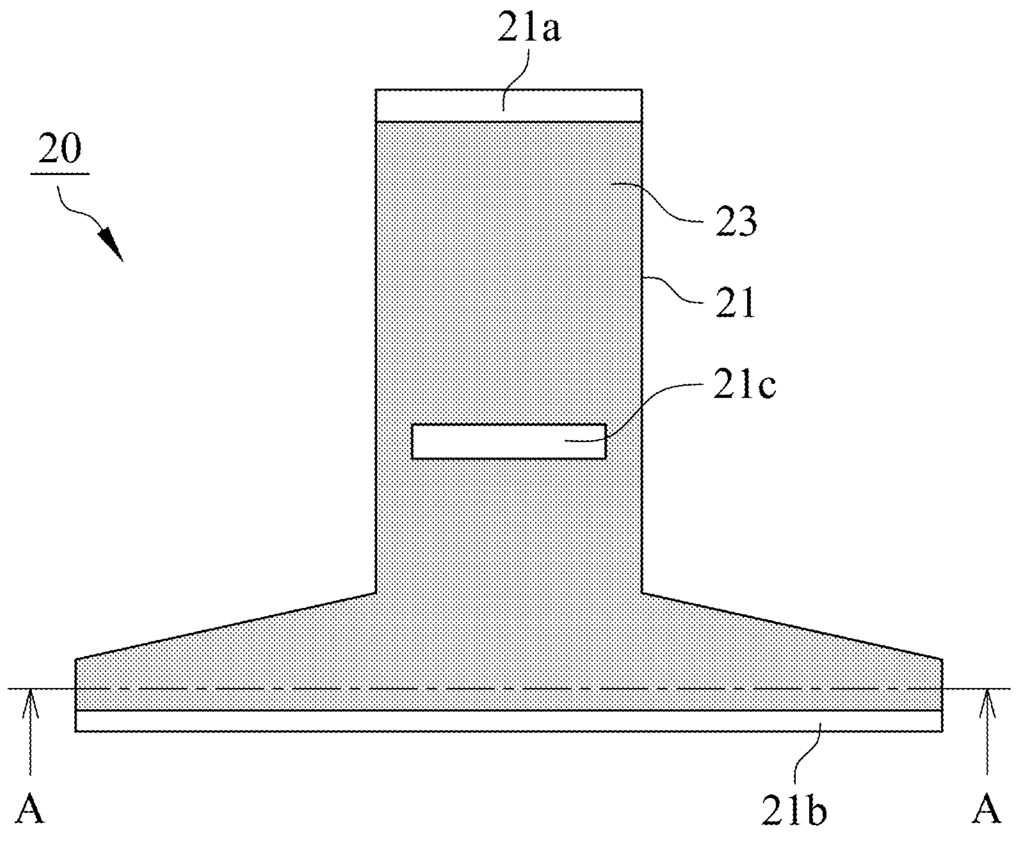
FIG. 1 is top view diagram illustrating a conventional flexible circuit board.
Figure 2:
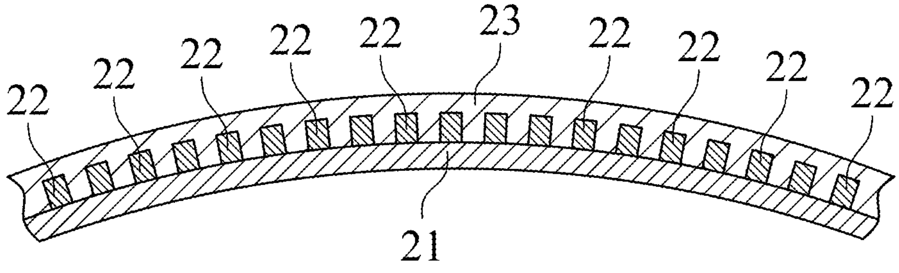
FIG. 2 is a cross-section view diagram along A-A line of FIG. 1.
Figure 3:
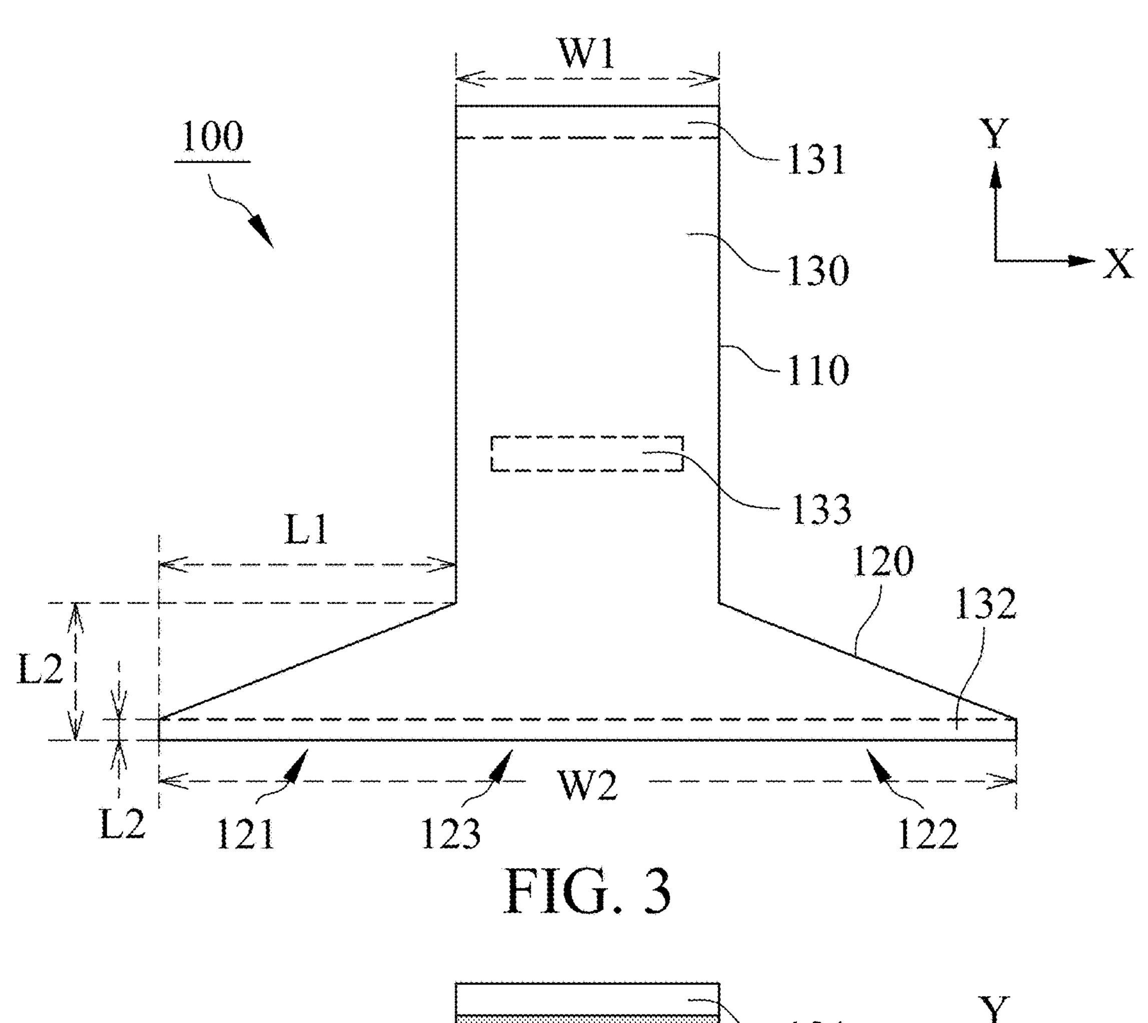
FIG. 3 is a top view diagram illustrating a flexible substrate in accordance with a first embodiment of the present invention.
Figure 4:
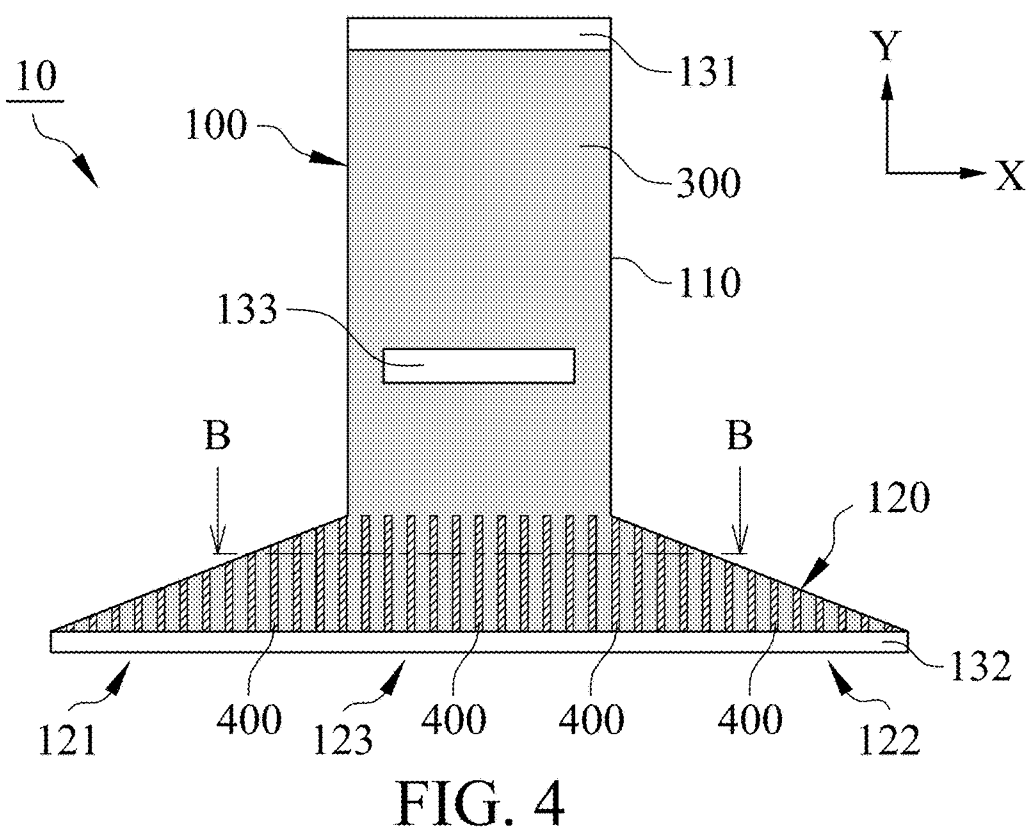
FIG. 4 is a top view diagram illustrating a flexible circuit board in accordance with a first embodiment of the present invention.
Figure 5:
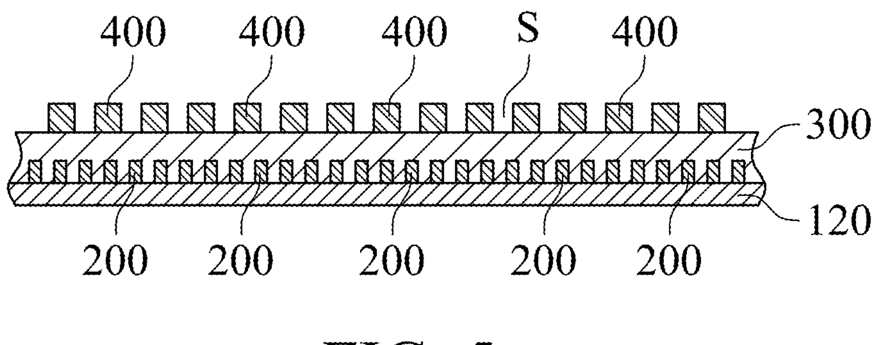
FIG. 5 is a cross-section view diagram along B-B line of FIG. 4.

In a first embodiment of the present invention as shown in FIGS. 3 to 5, a flexible circuit board 10 includes a flexible substrate 100 and circuit lines 200 arranged on a surface 130 of the flexible substrate 100. The flexible substrate 100 has a first part 110 and a second part 120 which are connected to each other. A first bonding area 131, a second bonding area 132 and a chip mounting area 133 are defined on the surface 130 of the flexible substrate 100. The first bonding area 131 is located on the free end of the first part 110, the second bonding area 132 is located on the free end of the second part 120, and the chip mounting area 133 is located between the first bonding area 131 and the second bonding area 132.

The flexible substrate 100 is, but not limit to, made of polyimide. In the first embodiment, each of the circuit lines 200 includes a Ni—Cr layer and a Cu layer, and the Ni—Cr layer is located between the flexible substrate 100 and the Cu layer. Each of the circuit lines 200 may further include a Sn layer formed on the Cu layer in other embodiments. Metal materials of the circuit lines 200 are not restricted in the present invention, other metal materials may be also suitable for the circuit lines 200.

Leads (not shown) of the circuit lines 200 are arranged on the first bonding area 131, the second bonding area 132 or the chip mounting area 133. The leads arranged on the first bonding area 131 and the second bonding area 132 are outer leads for bonding external electronic device(s), and the leads arranged on the chip mounting area 133 are inner leads for bonding a chip. The circuit lines 200 extending from the first bonding area 131 to the chip mounting area 133 are input circuit lines, and the circuit lines 200 extending from the chip mounting area 133 to the second bonding area 132 are output circuit lines which are more than the input circuit lines.

With reference to FIG. 3, the first part 110 has a first width W1 and the second part 120 has a second width W2 in a first direction X, and the second width W2 is greater than the first width W1 so the second part 120 is wider than the first part 110. The more output circuit lines are arranged on the wider second part 120. Preferably, the first width W1 is less than ⅔ of the second width W2.

With reference to FIG. 3, the second part 120 preferably includes a first protruding section 121, a second protruding section 122 and a connecting section 123. The connecting section 123 is located between and connected to the first protruding section 121 and the second protruding section 122 along the first direction X. In additional, the connecting section 123 is located on one side of the first part 110 in a second direction Y which intersects the first direction X, and the connecting section 123 is connected to the first part 110. In the first embodiment, the first direction X is horizontal, and the second direction Y is vertical.

With reference to FIG. 3, the first protruding section 121 has a first length L1 along the first direction X and a second length L2 along the second direction Y. The first length L1, which is the shortest distance from the side of the first part 110 to the side of the first protruding section 121, is longer than the second length L2 and it is between 15-35 mm (15 mm<L1<35 mm), and the second length L2 is between 3-15 mm (3 mm<L2<15 mm). In the first embodiment, the first protruding section 121 is trapezoid such that the second length L2 is reduced gradually from the connecting section 123 to the first protruding section 121, the first protruding section 121 and the second protruding section 122 have the same shape and size, and they are mirror symmetrical with respect to the connecting section 123.

With reference to FIGS. 4 and 5, the flexible circuit board 10 further includes a solder resist layer 300 and shaping strips 400. The solder resist layer 300 covers the surface 130 of the flexible substrate 100 and the circuit lines 200 to protect the circuit lines 200, but not cover the first bonding area 131, the second bonding area 132, the chip mounting area 133 and the leads of the circuit lines 200. The shaping strips 400 are extended along the second direction Y and arranged on the solder resist layer 300 located on the second part 120 with space arrangement along the first direction X. The shaping strips 400 are not connected to each other so there is a space S between the adjacent shaping strips 400, and the space S exposes the solder resist layer 300. Because of the solder resist layer 300 and the shaping strips 400, the top surface of the flexible circuit board 10 above the second part 120 is undulate.

During semiconductor assembly and test operations, the flexible circuit board 10 may be bent and/or deformed due to temperature variation, in general, both sides of the wider second part 120 are bent downwardly. During flat pressing process, the shaping strips 400 can help to shape the bent second part 120 such that the second part 120 and the flexible circuit board 10 can be shaped back to the original flat form.

The shaping strips 400 can be made of any suitable material, and in the first embodiment, a solder resist material is smeared on the solder resist layer 300 through screen printing to form the shaping strips 400. The shaping strips 400 and the solder resist layer 300 can be made of the same or different solder resist materials.

Figure 6:
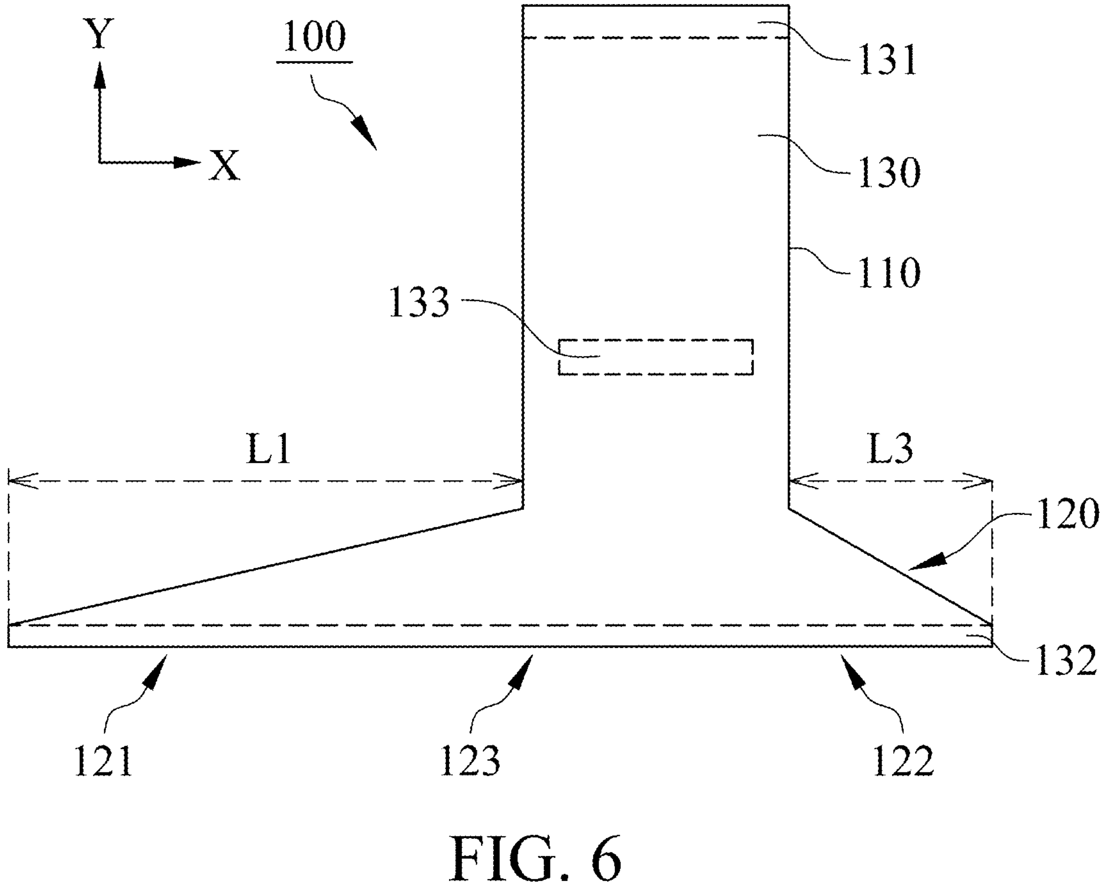
FIG. 6 is a top view diagram illustrating a flexible substrate in accordance with a second embodiment of the present invention.

In a second embodiment of the present invention as shown in FIG. 6, the second protruding section 122 has a size different to the first protruding section 121 and has a third length L3 which is the shortest distance from the side of the first part 110 to the side of the second protruding section 122 and is unequal to the first length L1 of the first protruding section 121. The third length L3 is less than the first length L1 in the second embodiment, and it may be greater than the first length L1 in other embodiments.

Figure 7:
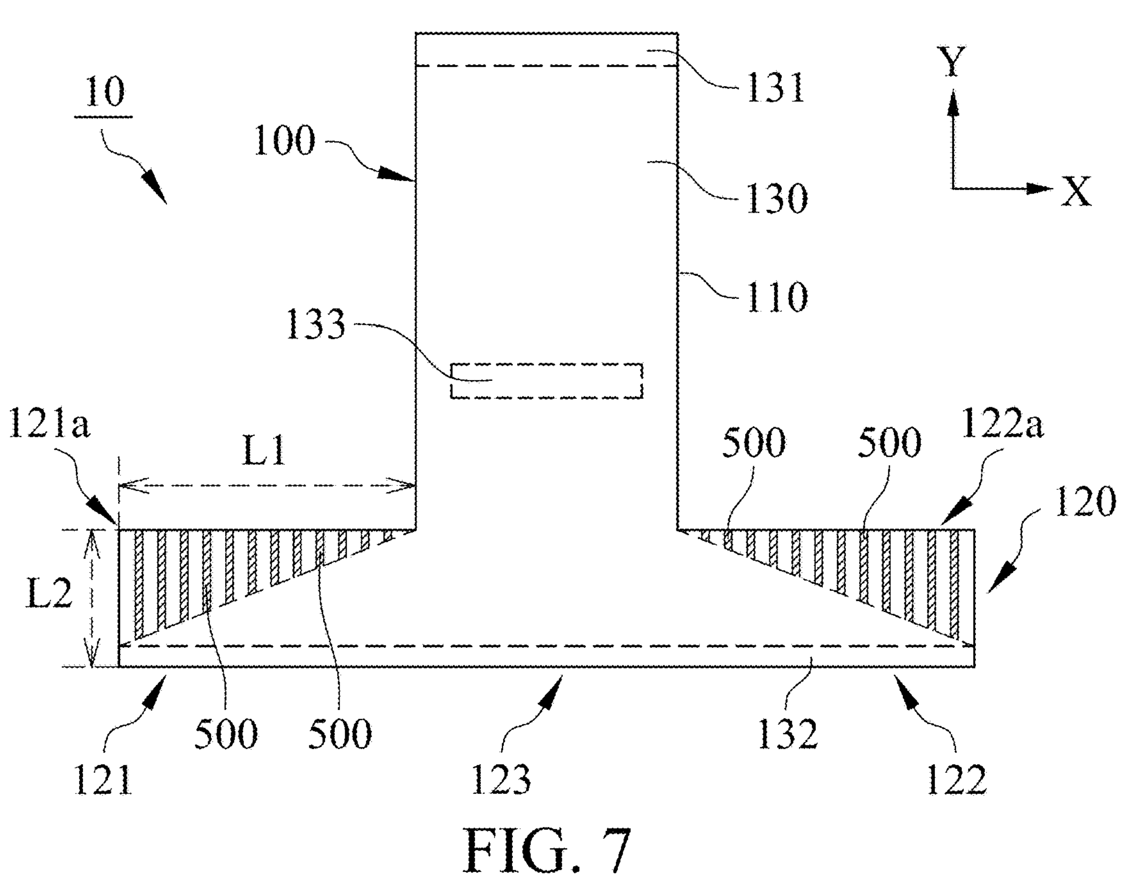
FIG. 7 is top view diagram illustrating a flexible substrate in accordance with a third embodiment of the present invention.
Figure 8:
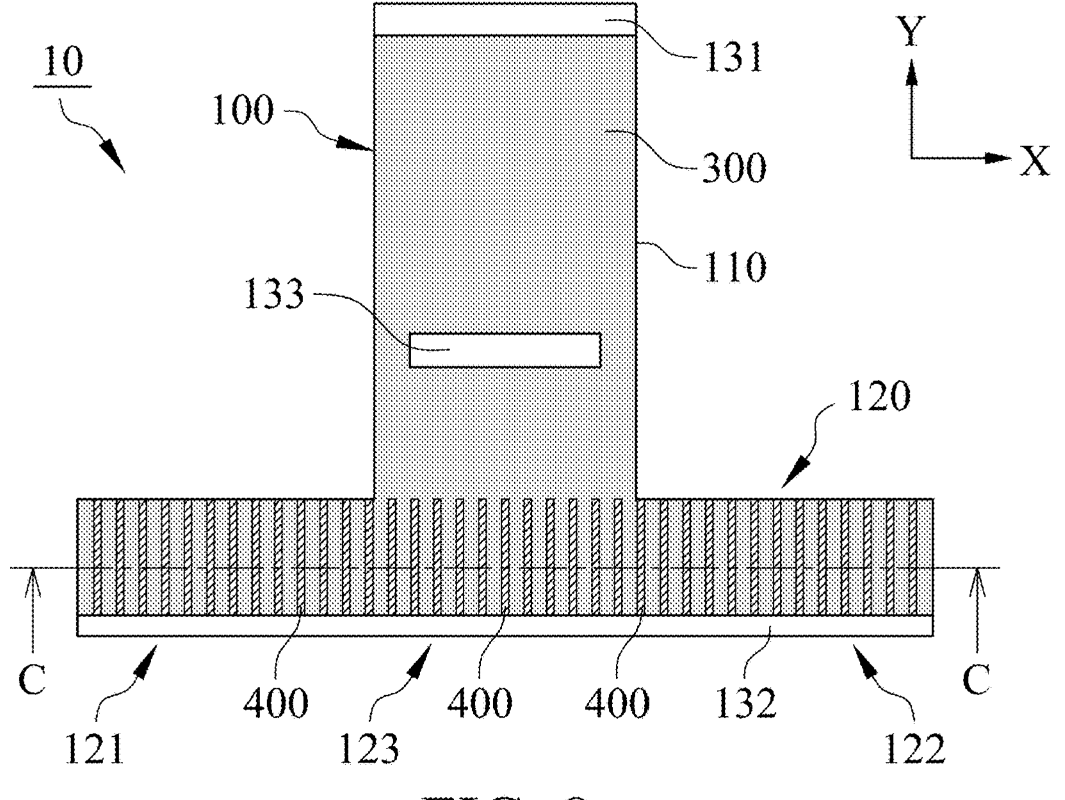
FIG. 8 is top view diagram illustrating a flexible circuit board in accordance with a third embodiment of the present invention.
Figure 9:
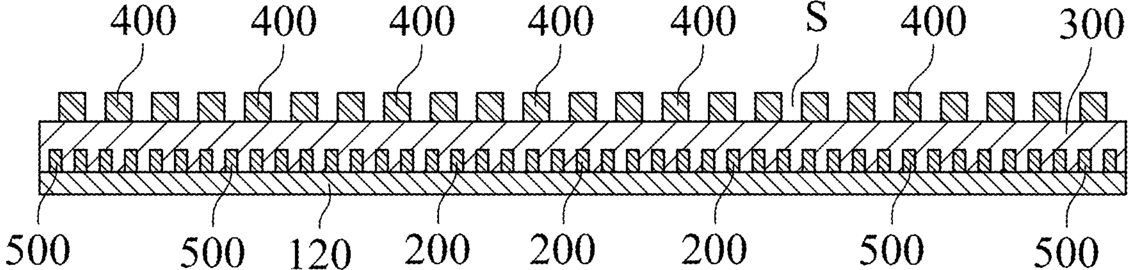
FIG. 9 is a cross-section view along C-C line of FIG. 8.

With reference to FIGS. 7 to 9, the flexible circuit board 10 further includes dummy lines 500 in a third embodiment of the present invention. The dummy lines 500 are provided on the first protruding section 121 and the second protruding section 122 and located on the area without the circuit lines 200. The dummy lines 500 are located on both sides of the circuit lines 200 in the first direction X. As shown in FIG. 7 which omits the circuit lines 200, the solder resist layer 300 and the shaping strips 400, the dummy lines 500 are extended along the second direction Y as same as the shaping strips 400. The dummy lines 500 can reduce the deformation of the second part 120, furthermore, because of the shaping strips 400 and the dummy lines 500, the deformed second part 120 can be shaped back to the original form easily after pressing the flexible circuit board 10.

With reference to FIG. 7, a first corner 121*a* of the first protruding section 121 and a second corner 122*a* of the second protruding section 122 are not connected to the connecting section 123 and not located on the second bonding area 132. Preferably, the dummy lines 500 are arranged on the first corner 121*a* and the second corner 122*a*. In the third embodiment, the length of the dummy lines 500 located on the first corner 121*a* of the first protruding section 121 is increased gradually from the connecting section 123 toward the side of the first protruding section 121, and the length of the dummy lines 500 located on the second corner 122*a* of the second protruding section 122 is increased gradually from the connecting section 123 to the side of the second protruding section 122.

In the present invention, the shaping strips 400 are provided above the second part 120 with space arrangement along the first direction X and extended along the second direction Y such that the top surface above the second part 120 is undulate. If both sides of the second part 120 are bent downwardly, the second part 120 can be shaped back to original flat one with the help of the shaping strips 400 after flat pressing the flexible circuit board 10.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

The invention claimed is:

1. A flexible circuit board comprising:

a flexible substrate including a first part and a second part which are connected to each other, a first width of the first part is less than a second width of the second part in a first direction;

a plurality of circuit lines arranged on a surface of the flexible substrate;

a solder resist layer configured to cover the surface and the plurality of circuit lines; and plurality of shaping strips arranged on the solder resist layer located on the second part along the first direction, a space exists between the adjacent shaping strips and exposes the solder resist layer, wherein the plurality of shaping strips are extended in a second direction which intersects the first direction, wherein the plurality of shaping strips are made of a solder resist material.

2. The flexible circuit board in accordance with claim 1, wherein the second part includes a first protruding section, a second protruding section and a connecting section which is located between the first and second protruding sections and connected to the first part.

3. The flexible circuit board in accordance with claim 1, wherein the first width is less than ⅔ of the second width.

4. The flexible circuit board in accordance with claim 2 further comprising a plurality of dummy lines, wherein the plurality of dummy lines are arranged on the first and second protruding sections and extended in the second direction.

5. The flexible circuit board in accordance with claim 4, wherein the first protruding section includes a first corner which is not connected to the connecting section, the second protruding section includes a second corner which is not connected to the connecting section, the plurality of dummy lines are located on the first and second corners.

6. The flexible circuit board in accordance with claim 2, wherein the first protruding section has a first length in the first direction and has a second length in the second direction, and the first length is greater than the second length.

7. The flexible circuit board in accordance with claim 6, wherein the second protruding section has a third length in the first direction, and the third length is less than the first length.

* * * * *